United States Patent
Son

(10) Patent No.: US 8,520,451 B2
(45) Date of Patent: Aug. 27, 2013

(54) INTERNAL VOLTAGE GENERATING CIRCUIT AND SEMICONDUCTOR MEMORY DEVICE

(75) Inventor: Jong Ho Son, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 13/243,440

(22) Filed: Sep. 23, 2011

(65) Prior Publication Data

US 2012/0195138 A1 Aug. 2, 2012

(30) Foreign Application Priority Data

Jan. 27, 2011 (KR) .................. 10-2011-0008322

(51) Int. Cl.
*G11C 7/00* (2006.01)
(52) U.S. Cl.
USPC ..................................... 365/189.07; 365/226
(58) Field of Classification Search
USPC ............................. 365/226, 189.05
See application file for complete search history.

(56) References Cited

U.S. PATENT DOCUMENTS

| 2009/0033406 A1* | 2/2009 | Kim | ........................ 327/534 |
| 2011/0044118 A1* | 2/2011 | Walker | ..................... 365/189.09 |

FOREIGN PATENT DOCUMENTS

| KR | 10-2007-0030474 A | 3/2007 |
| KR | 1020070030474 A | 3/2007 |
| KR | 10-0784918 B1 | 12/2007 |
| KR | 1020080076362 A | 8/2008 |
| KR | 10-2009-0027378 A | 3/2009 |

* cited by examiner

*Primary Examiner* — Michael Tran
(74) *Attorney, Agent, or Firm* — William Park & Associates Patent Ltd.

(57) ABSTRACT

A semiconductor memory device includes an internal voltage generating circuit and a memory cell. The internal voltage generating circuit is configured to compare a temperature voltage, which has a level varying with a predetermined slope according to a level change of an internal voltage, with a variable reference voltage, which has a level varying according to a temperature change, and pump the internal voltage. The memory cell includes a cell transistor having a threshold voltage controlled according to the internal voltage.

23 Claims, 4 Drawing Sheets

INTERNAL VOLTAGE GENERATING CIRCUIT AND SEMICONDUCTOR MEMORY DEVICE

CROSS-REFERENCES TO RELATED APPLICATIONS

The present application claims priority under 35 U.S.C 119(a) to Korean Application No. 10-2011-0008322, filed on Jan. 27, 2011, in the Korean intellectual property Office, which is incorporated herein by reference in its entirety.

BACKGROUND

In general, a semiconductor memory device receives a power supply voltage VDD and a ground voltage VSS from an external source and generates internal voltages necessary for internal operations. Examples of the internal voltages include a core voltage VCORE supplied to a core region, a peripheral voltage VPERI supplied to a peripheral region, a high voltage VPP used to drive a word line or used in an overdriving operation, and a back bias voltage VBB supplied to a silicon substrate or a bulk.

Herein, the core voltage VCORE is generated by decreasing the external power supply voltage VDD to a predetermined level; the high voltage VPP has a higher level than the external power supply voltage VDD; and the back bias voltage VBB maintains a lower level than the external ground voltage VSS. Therefore, a charge pump circuit is necessary to supply charges to supply the high voltage VPP and the back bias voltage VBB.

The back bias voltage VBB is supplied to a bulk or a silicon substrate of the semiconductor memory device to stabilize an operation of the semiconductor memory device.

The back bias voltage VBB prevents a PN junction of a transistor of the semiconductor memory device from being forward-biased, thus preventing a latch-up phenomenon and a data loss of a memory cell. Also, the back bias voltage VBB prevents a threshold voltage of a transistor from changing due to a back gate effect, thus stabilizing the semiconductor memory device. Also, the back bias voltage VBB increases the level of a threshold voltage of a transistor, thus reducing the quantity of leakage current generated at the threshold voltage.

The back bias voltage VBB is maintained at a constant level (e.g., −0.8 V) independent of temperature changes. However, the level of the threshold voltage increases with decreasing temperature.

Thus, when a back bias voltage remaining constant from room to low temperature is provided to a transistor in a semiconductor memory device operating at low temperature, the threshold voltage would increase too high and prevent a sufficient charge transfer through the transistor.

In particular, a back bias voltage VBB is provided to control the threshold voltage of a cell transistor in a semiconductor memory device including MOS transistors. However, the threshold voltage of the cell transistor would increase too high at low temperature, and it would thus prevent sufficient charge sharing between the cell transistor and a bit line. Thus, when the semiconductor memory device performs an active operation at low temperature, a bit line sense amplifier senses and amplifies the bit line, which fails to share sufficient charges with the cell capacitor, thus causing a sensing failure.

SUMMARY

An embodiment of the present invention relates to a semiconductor memory device including an internal voltage generating circuit that generates an internal voltage having a level controlled according to temperature.

In an embodiment, a semiconductor memory device may include: an internal voltage generating circuit configured to compare a temperature voltage, which has a level varying with a predetermined slope according to a level change of an internal voltage, with a variable reference voltage, which has a level varying according to a temperature change, and pump the internal voltage; and a memory cell comprising a cell transistor having a threshold voltage controlled according to the internal voltage.

Further, an internal voltage generating circuit may include: a temperature voltage generating unit configured to buffer a reference voltage having a predetermined level according to a temperature change, generate a buffer voltage, and generate a temperature voltage in response to the buffer voltage and an internal voltage; an enable signal generating unit configured to compare the temperature voltage with a variable reference voltage and generate an enable signal; and a voltage pumping unit configured to pump the internal voltage in response to the enable signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
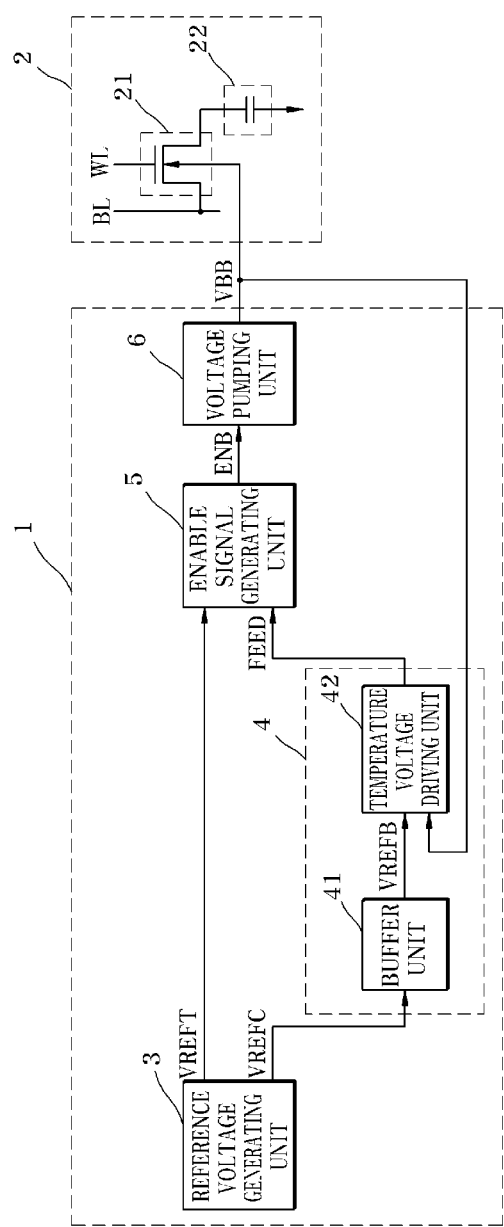
FIG. 1 is a block diagram of a semiconductor memory device including an internal voltage generating circuit according to an embodiment of the present invention.

FIG. 1 is a block diagram of a semiconductor memory device including an internal voltage generating circuit according to an embodiment of the present invention.

Referring to FIG. 1, a semiconductor memory device according to an embodiment of the present invention includes an internal voltage generating circuit 1 and a memory cell 2. The internal voltage generating circuit 1 includes a reference voltage generating unit 3, a temperature voltage generating unit 4, an enable signal generating unit 5, and a voltage pumping unit 6. The temperature voltage generating unit 4 includes a buffer unit 41 and a temperature voltage driving unit 42. The memory cell 2 includes a cell transistor 21 and a cell capacitor 22. The cell transistor 21 has a threshold voltage controlled according to a back bias voltage VBB. The cell capacitor 22 is configured to share charges with a bit line BL when a word line is selected to turn on the cell transistor 21.

Figure 2:
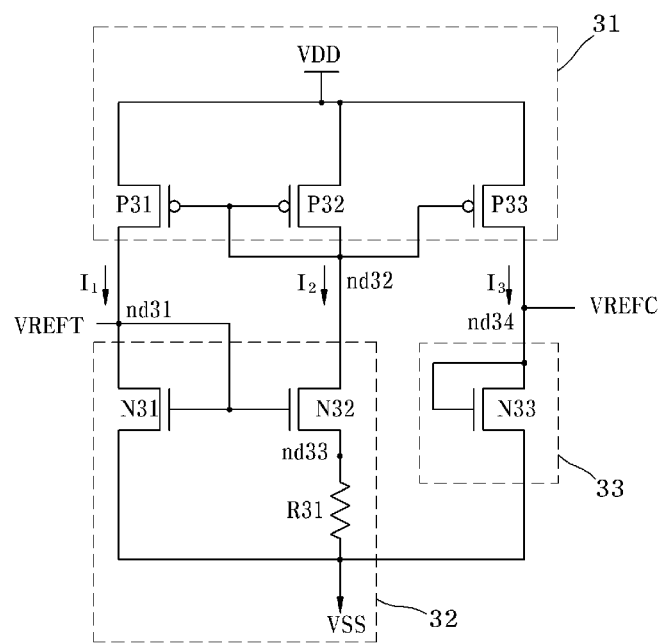
FIG. 2 is an example circuit diagram of a reference voltage generating unit in the internal voltage generating circuit illustrated in FIG. 1.

FIG. 2 is a circuit diagram of an example of the reference voltage generating unit 3 in the internal voltage generating circuit 1 illustrated in FIG. 1.

Referring to FIG. 2, the reference voltage generating unit 3 includes a constant current source 31, a variable reference voltage setting unit 32, and a reference voltage setting unit 33. The constant current source 31 includes PMOS transistors P31 to P33 configured to share the voltage of a node nd32 as a gate voltage to form a current mirror and generate first to third currents $I_1$ to $I_3$. The PMOS transistors P31 to P33 may be configured to have the same size. The variable reference voltage setting unit 32 includes an NMOS transistor N31 connected between a node nd31 and a ground voltage (VSS) terminal to be turned on in response to a variable reference voltage VREFT; an NMOS transistor N32 connected between a node nd32 and a node n33 to be turned on in response to the variable reference voltage VREFT; and a resistance element R31 connected between the node nd33 and the ground voltage (VSS) terminal. The reference voltage setting unit 33 includes an NMOS transistor N33 connected between a node nd34 and the ground voltage (VSS) terminal to be turned on in response to a reference voltage VREFC. The temperature-dependent characteristics of the variable reference voltage VREFT generated by the variable reference voltage generating unit 32 and the reference voltage VREFC generated by the reference voltage generating unit 33 will be described below in detail with reference to equations.

As a same voltage is present at the node nd31, the node nd32, and the node nd34, the following equation arises:

$$Vgs(N31) = Vgs(N32) + I_2 R31 = Vgs(N33) \quad \text{[EQUATION 1]}$$

Herein, 'Vgs(N31)' denotes a gate-source voltage difference of the NMOS transistor N31; 'Vgs(N32)' denotes a gate-source voltage difference of the NMOS transistor N32; and 'Vgs(N33)' denotes a gate-source voltage difference of the NMOS transistor N33. Also, the first to third currents $I_1$ to $I_3$ have the same current quantity, and the MOS transistor has the characteristics of:

$$Vgs = V_{th} + \sqrt{\frac{2I}{\mu_n C_{ox} \frac{W}{L}}} \quad \text{[EQUATION 2]}$$

Thus, the variable reference voltage VREFT and the reference voltage VREFC may be defined by the following equations.

$$VREFT = V_{th} + \frac{2}{R\mu_n C_{ox} \sqrt{\frac{W1}{L1}}} \left[ \sqrt{\frac{1}{\frac{W2}{L2}}} - \sqrt{\frac{1}{\frac{W1}{L1}}} \right] \quad \text{[EQUATION 3]}$$

$$VREFC = V_{th} + \frac{2}{R\mu_n C_{ox} \sqrt{\frac{W3}{L3}}} \left[ \sqrt{\frac{1}{\frac{W2}{L2}}} - \sqrt{\frac{1}{\frac{W1}{L1}}} \right] \quad \text{[EQUATION 4]}$$

where 'Vth' is the threshold voltage of the NMOS transistors N31 to N33; 'R' is the resistance of the resistance element R31; '$\mu_n$' is average mobility; '$C_{ox}$' is a constant value determined by the characteristics of the NMOS transistors N31 to N33; 'W1' is the channel width of the NMOS transistor N31; 'L1' is the gate length of the NMOS transistor N31; 'W2' is the channel width of the NMOS transistor N32; 'L2' is the gate length of the NMOS transistor N32; 'W3' is the channel width of the NMOS transistor N33; and 'L3' is the gate length of the NMOS transistor N33.

In the Equations 3-4 of the variable reference voltage VREFT and the reference voltage VREFC, 'Vth' and '$\mu_n$' increase with decreasing temperature, and 'R' decreases with decreasing temperature. Thus, the sizes of the NMOS transistor N31 and the NMOS transistor N32, i.e., W1, L1, W2, and L2, may be controlled so as to generate a higher level of the variable reference voltage VREFT as the temperature decreases. Also, the size of the NMOS transistor N33, i.e., W3 and L3, may be controlled so that the reference voltage VREFC is generated to remain at a constant level independent of the changes in temperature. In an embodiment, the variable reference voltage VREFT may be set to approximately 0.55 V at approximately 90° C. and approximately 0.62 at approximately −40° C., and the reference voltage VREFC may be set to approximately 1 V independent of the temperature.

Figure 3:
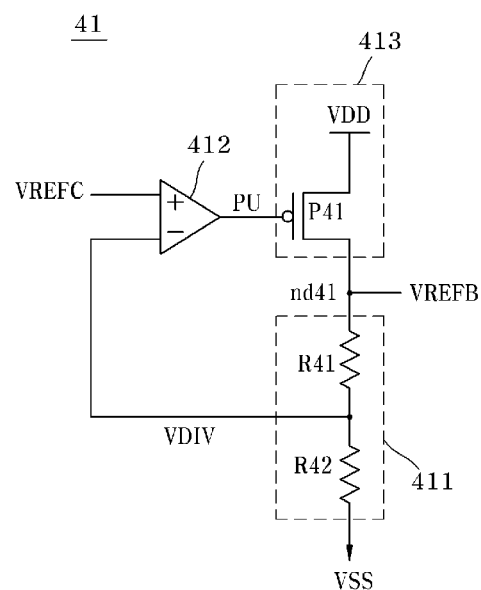
FIG. 3 is an example circuit diagram of a buffer unit in the internal voltage generating circuit illustrated in FIG. 1.

FIG. 3 is an example circuit diagram of the buffer unit 41 in the internal voltage generating circuit 1 illustrated in FIG. 1 according to an embodiment of the present invention.

Referring to FIG. 3, the buffer unit 41 includes a voltage dividing unit 411, a comparing unit 412, and a driving unit 413. The voltage dividing unit 411 includes resistance elements R41 and R42 configured to divide a buffer voltage VREFB and generate a divided voltage VDIV. The comparing unit 412 is configured to compare the divided voltage VDIV with the reference voltage VREFC and generate a pull-up signal PU. The driving unit 413 is configured to pull-up drive an output node nd41 of the buffer voltage VREFB to a power supply voltage VDD in response to the pull-up signal PU. Accordingly, the buffer unit 41 pull-up drives the buffer voltage VREFB when the divided voltage VDIV has a lower level than the reference voltage VREFC. When the resistance elements R41 and R42 have the same resistance value, the buffer voltage VREFB is pull-up driven until it has an approximately twofold higher level than the reference voltage VREFC.

Figure 4:
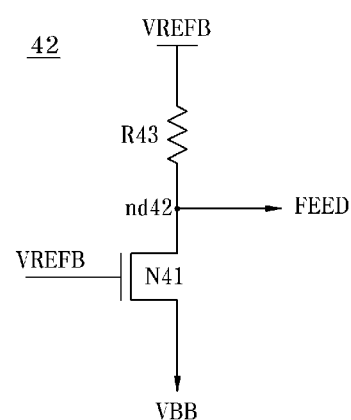
FIG. 4 is an example circuit diagram of a temperature voltage driving unit in the internal voltage generating circuit illustrated in FIG. 1.

FIG. 4 is an example circuit diagram of the temperature voltage driving unit 42 in the internal voltage generating circuit 1 illustrated in FIG. 1 according to an embodiment of the present invention.

Referring to FIG. 4, the temperature voltage driving unit 42 includes a resistance element R43 (e.g., a passive element) and an NMOS transistor N41. The resistance element R43 is connected between a supply terminal of the buffer voltage VREFB and an output node nd42 of a temperature voltage FEED, and the NMOS transistor N41 (i.e., a pull-down element) is connected between the output node nd42 and a supply terminal of a back bias voltage VBB, which is to be turned on in response to the buffer voltage VREFB. With decreasing level of the back bias voltage VBB, the gate-source voltage of the NMOS transistor N41 (e.g., Vgs(N41)) will increase. Then, the temperature voltage FEED will decrease in a slope set according to the temperature change. Herein, the slope of the temperature voltage FEED is set according to the temperature change. That is, with decreasing temperature, the slope of the temperature voltage FEED (that is, a level change of the temperature voltage FEED depending on the back bias voltage VBB) increases.

Figure 5:
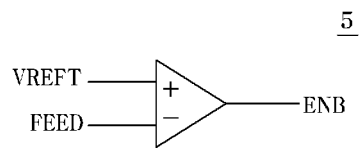
FIG. 5 is an example circuit diagram of an enable signal generating unit in the internal voltage generating circuit illustrated in FIG. 1.

FIG. 5 is an example circuit diagram of the enable signal generating unit 5 in the internal voltage generating circuit 1 illustrated in FIG. 1 according to an embodiment of the present invention.

Referring to FIG. 5, the enable signal generating unit 5 is configured to compare the temperature voltage FEED with the variable reference voltage VREFT and generate an enable signal ENB. When the temperature voltage FEED has a higher level than the variable reference voltage VREFT, the enable signal ENB is activated to a logic low level; and when the temperature voltage FEED has a lower level than the variable reference voltage VREFT, the enable signal ENB is deactivated to a logic high level.

The voltage pumping unit 6 is configured to pump the back bias voltage VBB in response to the enable signal ENB activated to a logic low level. That is, the voltage pumping unit 6 is configured to pump the back bias voltage VBB when the temperature voltage FEED has a higher level than the variable reference voltage VREFT.

Figure 6:
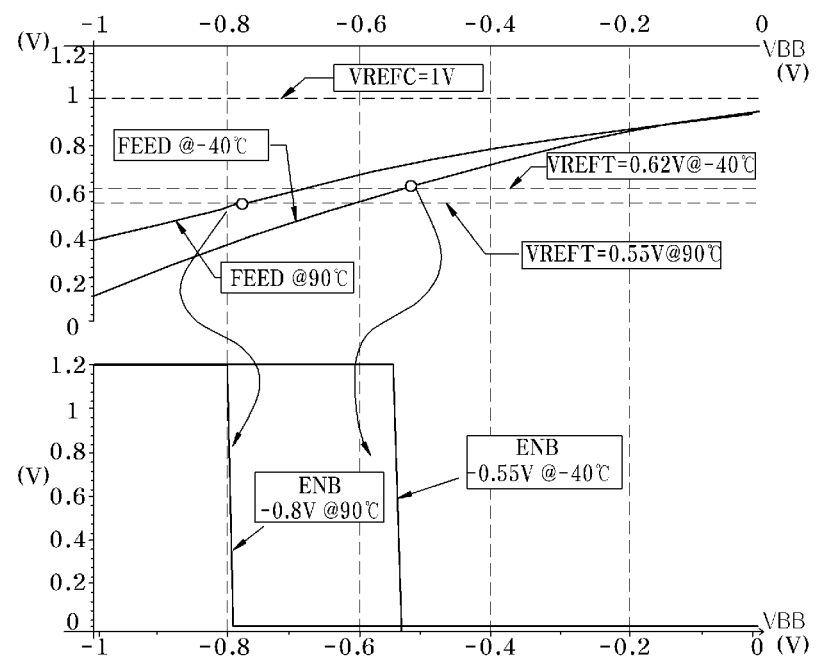
FIG. 6 is a diagram illustrating an example of an operation of the internal voltage generating circuit illustrated in FIG. 1.

FIG. 6 illustrates an example operation of the internal voltage generating circuit 1 illustrated in FIG. 1 according to an embodiment of the present invention.

Referring to FIG. 6, the variable reference voltage VREFT generated by the reference voltage generating unit 3 is set to a higher level as the temperature decreases. For example, the variable reference voltage VREFT is approximately 0.55 V at approximately 90° C. and approximately 0.62 V at approximately 40° C. The reference voltage VREFC generated by the reference voltage generating unit 3 is set to approximately 1 V independent of temperature change.

The level of the temperature voltage FEED generated by the temperature voltage generating unit 4 decreases with a slope set according to the temperature, as the level of the back bias voltage VBB decreases. That is, the slope of the temperature voltage FEED increases as the temperature decreases. For example, a level decrease of the temperature voltage FEED according to a level decrease of the back bias voltage VBB is larger at −40° C. than at 90° C.

When the temperature voltage FEED is higher in voltage level than the variable reference voltage VREFT, the enable signal generating unit 5 generates the enable signal ENB activated to a logic low level and drives the voltage pumping unit 6. When the back bias voltage VBB is set to 0 V, the pumping operations of the voltage pumping unit 6 at −40° C. and 90° C. are as follows.

At −40° C., the temperature voltage FEED has a higher level than the variable reference voltage VREFT until the back bias voltage VBB decreases from 0 V to −0.55 V. Therefore, the back bias voltage VBB is pumped to decrease the voltage level by maintaining the enable signal ENB at a logic low level, i.e., an activation state. When the back bias voltage VBB decreases below −0.55 V, the enable signal ENB is deactivated to a logic high level so as to stop the pumping operation of the back bias voltage VBB.

On the other hand, at 90° C., the temperature voltage FEED has a higher level than the variable reference voltage VREFT until the back bias voltage VBB decreases from 0 V to −0.8 V. Therefore, the back bias voltage VBB is pumped to decrease the voltage level by maintaining the enable signal ENB at a logic low level, i.e., an activation state. When the back bias voltage VBB decreases below −0.8 V, the enable signal ENB is deactivated to a logic high level so as to stop the pumping operation of the back bias voltage VBB.

As described above, the internal voltage generating unit according to an embodiment of the present invention pumps the back bias voltage VBB to approximately −0.55V at −40° C. and pumps the back bias voltage VBB to approximately −0.8 V at 90° C. That is, the back bias voltage VBB generated by the internal voltage generating unit is pumped to a higher level at a lower temperature according to an embodiment of the present invention.

Thus, according to an embodiment of the present invention, when the back bias voltage VBB generated by the internal voltage generating unit is supplied to the cell transistor 21 of the memory cell 2, the threshold voltage of the cell transistor 21 is set to a low level at a low temperature, thus providing a sufficient charge sharing between the cell capacitor 22 and the bit line BL. Also, the back bias voltage VBB is set to a high level at a high temperature, thus reducing the leakage current flowing through the cell transistor 21.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   an internal voltage generating unit configured to compare a temperature voltage and a variable reference voltage for pumping an internal voltage, wherein the temperature voltage has a varying with a predetermined slope with the internal voltage change and wherein the variable reference voltage has a level varying with temperature change; and
   a memory cell comprising a cell transistor having a threshold voltage controlled according to the internal voltage, wherein the level of the temperature voltage decreases in proportion to decreasing level of the internal voltage.

2. The semiconductor memory device of claim 1, wherein the slope of the temperature voltage increases with decreasing temperature.

3. The semiconductor memory device of claim 2, wherein the level of the variable reference voltage is set to increase with decreasing temperature.

4. The semiconductor memory device of claim 1, wherein the internal voltage generating unit comprises:
   a temperature voltage generating unit configured to buffer a reference voltage having a predetermined level according to the temperature change, generate a buffer voltage, and generate the temperature voltage in response to the buffer voltage and the internal voltage;
   an enable signal generating unit configured to compare the temperature voltage with the variable reference voltage and generate an enable signal; and
   a voltage pumping unit configured to pump the internal voltage in response to the enable signal.

5. The semiconductor memory device of claim 4, wherein the temperature voltage generating unit comprises:
   a buffer unit configured to buffer the reference voltage and generate the buffer voltage; and
   a temperature voltage driving unit configured to drive the temperature voltage according to the buffer voltage and the internal voltage.

6. The semiconductor memory device of claim 5, wherein the buffer unit comprises:
   a voltage dividing unit configured to divide the buffer voltage and generate a divided voltage;
   a comparing unit configured to compare the divided voltage with the reference voltage and generate a pull-up signal; and
   a driving unit configured to drive the buffer voltage in response to the pull-up signal.

7. The semiconductor memory device of claim 5, wherein the temperature voltage driving unit increases a driving force for pull-down driving the temperature voltage, as the level of the internal voltage decreases.

8. The semiconductor memory device of claim 5, wherein the temperature voltage driving unit comprises:
   a passive element connected between a supply terminal of the buffer voltage and an output node of the temperature voltage; and a pull-down element configured to pull-down drive the output node of the temperature voltage by a driving force set according to a voltage difference between the buffer voltage and the internal voltage.

9. The semiconductor memory device of claim 4, wherein the enable signal generating unit generates the enable signal so that the voltage pumping unit pumps the internal voltage when the temperature voltage is higher in voltage level than the variable reference voltage.

10. The semiconductor memory device of claim 4, wherein the internal voltage generating unit further comprises a reference voltage generating unit configured to control the size of first and second MOS transistors to generate the variable reference voltage, and control the size of a third MOS transistor to generate the reference voltage.

11. The semiconductor memory device of claim 10, wherein the reference voltage generating unit comprises:
a constant current source configured to generate first, second, and third currents; a variable reference voltage setting unit comprising the first and second MOS transistors and a resistance element, wherein the variable reference voltage setting unit is configured to receive the first and second currents and set the variable reference voltage; and
a reference voltage setting unit comprising the third MOS transistor configured to receive the third current and set the reference voltage.

12. The semiconductor memory device of claim 11, wherein the first MOS transistor is connected between a ground voltage terminal and a supply node of the first current to be turned on in response to the variable reference voltage, and is connected between the resistance element and a supply node of the second current to be turned on in response to the variable reference voltage.

13. The semiconductor memory device of claim 12, wherein the third MOS transistor is connected between the ground voltage terminal and a supply node of the third current to be turned on in response to the reference voltage.

14. An internal voltage generating unit comprising:
a temperature voltage generating unit configured to buffer a reference voltage having a predetermined level according to a temperature change, generate a buffer voltage, and generate a temperature voltage in response to the buffer voltage and an internal voltage;
an enable signal generating unit configured to compare the temperature voltage with a variable reference voltage and generate an enable signal; and
a voltage pumping unit configured to pump the internal voltage in response to the enable signal, wherein the level of the temperature voltage decreases in proportion to decreasing level of the internal voltage.

15. The internal voltage generating unit of claim 14, wherein the temperature voltage generating unit comprises:
a buffer unit configured to buffer the reference voltage and generate the buffer voltage; and
a temperature voltage driving unit configured to drive the temperature voltage according to the buffer voltage and the internal voltage.

16. The internal voltage generating unit of claim 15, wherein the buffer unit comprises:

a voltage dividing unit configured to divide the buffer voltage and generate a divided voltage;
a comparing unit configured to compare the divided voltage with the reference voltage and generate a pull-up signal; and
a driving unit configured to drive the buffer voltage in response to the pull-up signal.

17. The internal voltage generating unit of claim 15, wherein the temperature voltage driving unit increases a driving force for pull-down driving the temperature voltage, as the level of the internal voltage decreases.

18. The internal voltage generating unit of claim 15, wherein the temperature voltage driving unit comprises:
a passive element connected between a supply terminal of the buffer voltage and an output node of the temperature voltage; and
a pull-down element configured to pull-down drive the output node of the temperature voltage by a driving force set according to a voltage difference between the buffer voltage and the internal voltage.

19. The internal voltage generating unit of claim 14, wherein the enable signal generating unit generates the enable signal so that the voltage pumping unit pumps the internal voltage when the temperature voltage is higher in voltage level than the variable reference voltage.

20. The internal voltage generating unit of claim 14, wherein the internal voltage generating unit further comprises a reference voltage generating unit configured to control the size of first and second MOS transistors to generate the variable reference voltage, and control the size of a third MOS transistor to generate the reference voltage.

21. The internal voltage generating unit of claim 20, wherein the reference voltage generating unit comprises:
a constant current source configured to generate first, second, and third currents; a variable reference voltage setting unit comprising the first and second MOS transistors and a resistance element, wherein the variable reference voltage setting unit is configured to receive the first and second currents and set the variable reference voltage; and
a reference voltage setting unit comprising the third MOS transistor configured to receive the third current and set the reference voltage.

22. The internal voltage generating unit of claim 21, wherein the first MOS transistor is connected between a ground voltage terminal and a supply node of the first current to be turned on in response to the variable reference voltage, and is connected between the resistance element and a supply node of the second current to be turned on in response to the variable reference voltage.

23. The internal voltage generating unit of claim 22, wherein the third MOS transistor is connected between the ground voltage terminal and a supply node of the third current to be turned on in response to the reference voltage.

* * * * *